(12) United States Patent
Aizawa

(10) Patent No.: US 7,502,970 B2
(45) Date of Patent: Mar. 10, 2009

(54) MEMORY DEVICE AND MEMORY CARD

(75) Inventor: Hideo Aizawa, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 556 days.

(21) Appl. No.: 10/890,174

(22) Filed: Jul. 14, 2004

(65) Prior Publication Data

US 2005/0041553 A1  Feb. 24, 2005

(30) Foreign Application Priority Data

Jul. 18, 2003  (JP)  ............................. 2003-199143
Jun. 23, 2004  (JP)  ............................. 2004-185408

(51) Int. Cl.
*G06F 11/00* (2006.01)

(52) U.S. Cl. .......................................... 714/42; 714/48

(58) Field of Classification Search .................. 714/42, 714/48, 54, 719, 723
See application file for complete search history.

(56) References Cited

U.S. PATENT DOCUMENTS

| 5,475,693 | A | * | 12/1995 | Christopherson et al. ... 714/710 |
| 5,594,689 | A | * | 1/1997 | Kato ...................... 365/185.09 |
| 6,032,264 | A | * | 2/2000 | Beffa et al. ..................... 714/7 |
| 6,058,047 | A | * | 5/2000 | Kikuchi ................. 365/185.33 |
| 6,219,280 | B1 | * | 4/2001 | Naganawa ............. 365/185.22 |
| 6,507,518 | B2 | | 1/2003 | Hosono et al. |
| 2001/0048609 | A1 | * | 12/2001 | Hikida ..................... 365/185.2 |
| 2001/0052093 | A1 | * | 12/2001 | Oshima et al. .............. 714/719 |
| 2002/0051385 | A1 | * | 5/2002 | Hosono et al. ......... 365/185.22 |
| 2002/0069381 | A1 | * | 6/2002 | Jeong et al. ................. 714/704 |
| 2003/0107918 | A1 | * | 6/2003 | Koyama et al. ........ 365/185.09 |

FOREIGN PATENT DOCUMENTS

| JP | 5-282880 | 10/1993 |
| JP | 5-282887 | 10/1993 |
| JP | 6-131884 | 5/1994 |
| JP | 6-348603 | 12/1994 |
| JP | 10-511799 | 11/1998 |
| JP | 11-213692 | 8/1999 |
| JP | 2000-173289 | 6/2000 |
| JP | 2000-181805 | 6/2000 |
| JP | 2003-58432 | 2/2003 |
| JP | 2003-76615 | 3/2003 |
| JP | 2003-99333 | 4/2003 |

* cited by examiner

*Primary Examiner*—Marc Duncan
(74) *Attorney, Agent, or Firm*—Oblon, Spivak, McClelland, Maier & Neustadt, P.C.

(57) ABSTRACT

A memory device comprises a data storage section, a section which compares in write processing, for data being target of the write processing, a state before the data is stored in the data storage section with a state of the data which is stored in the data storage section and read out from the data storage section, a section which obtains the number of errors for the write processing on the basis of a comparison result from the comparison section, and a section which returns the number of errors.

10 Claims, 12 Drawing Sheets

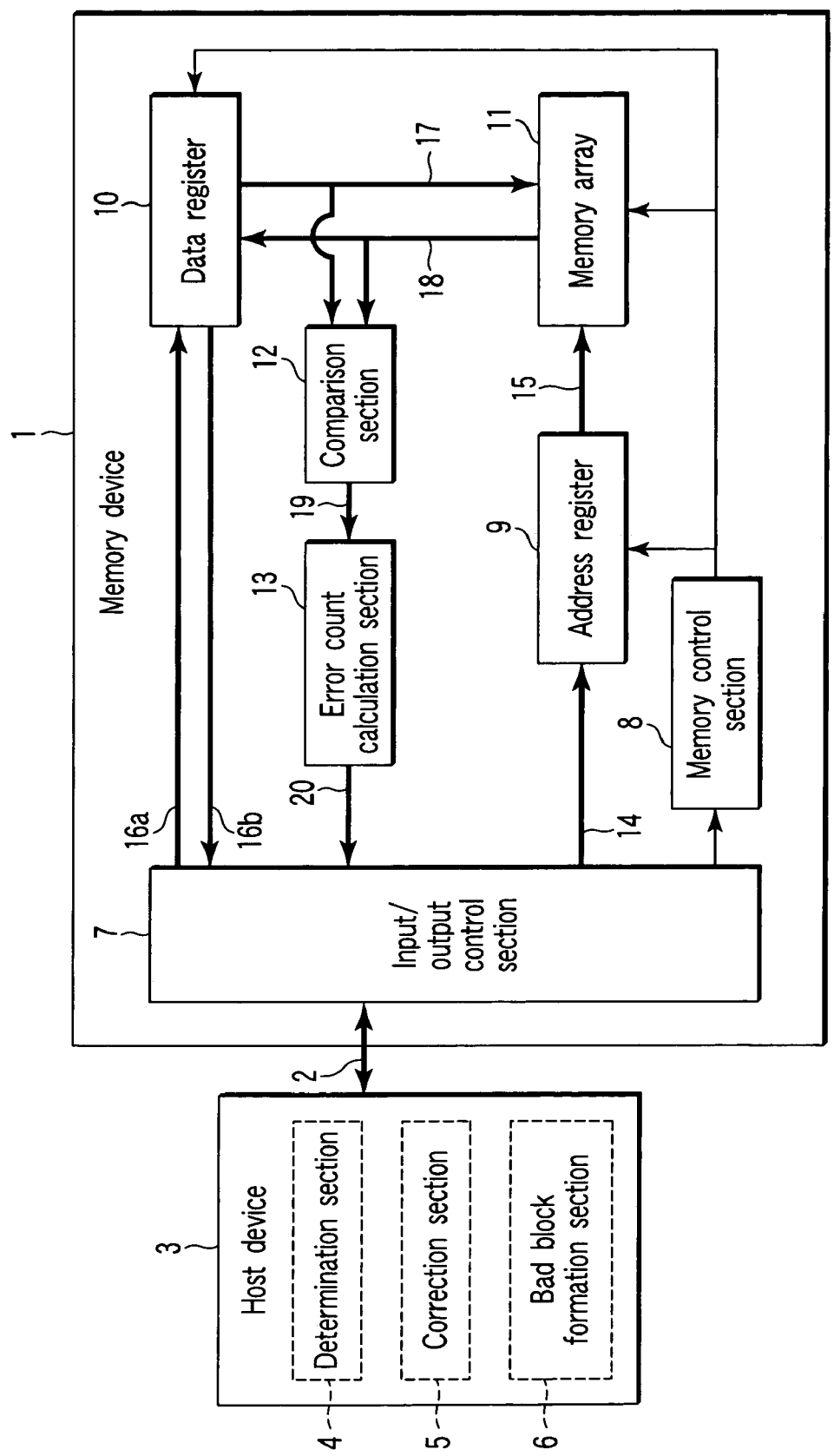
F I G. 1

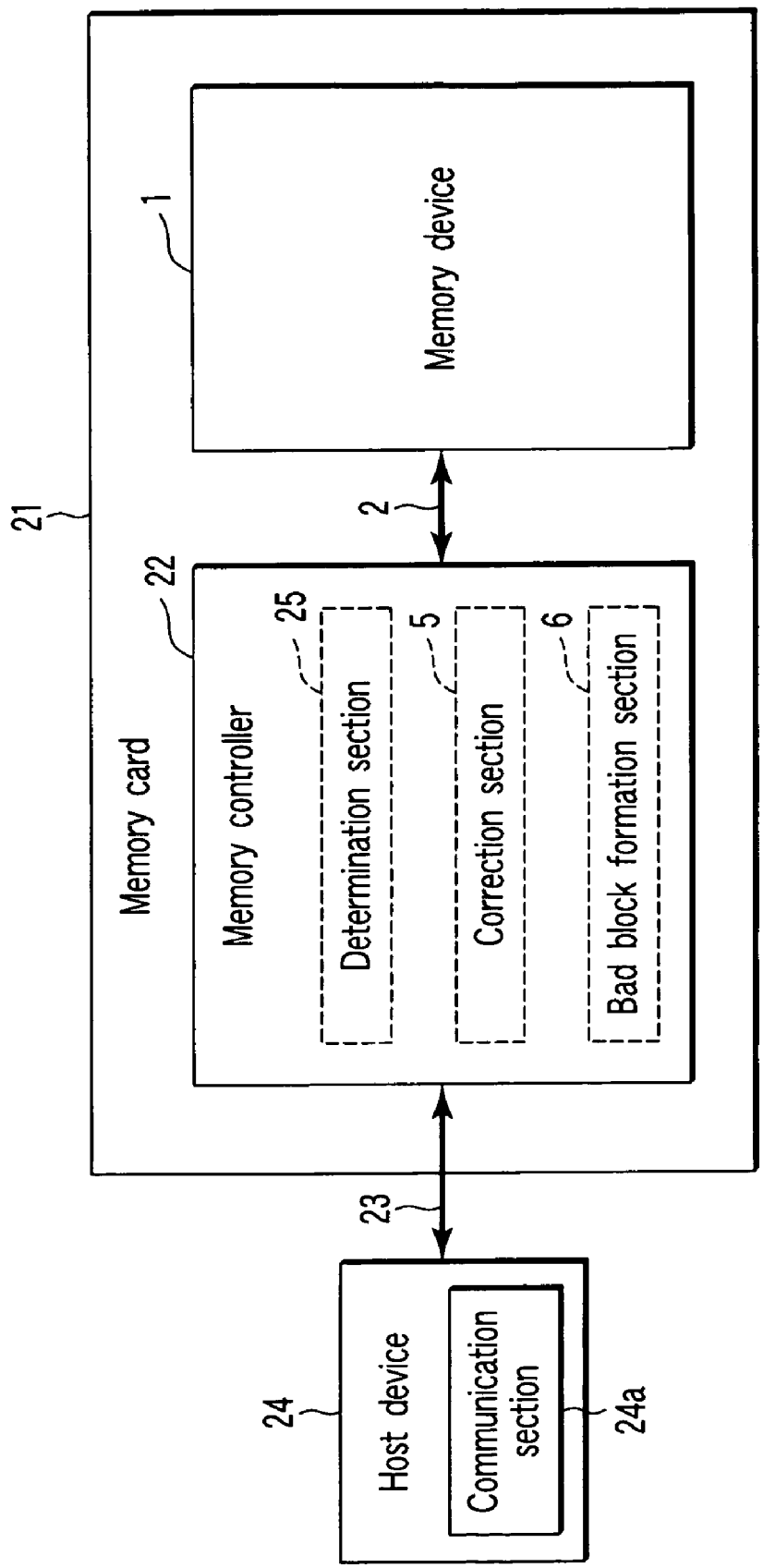
F I G. 7

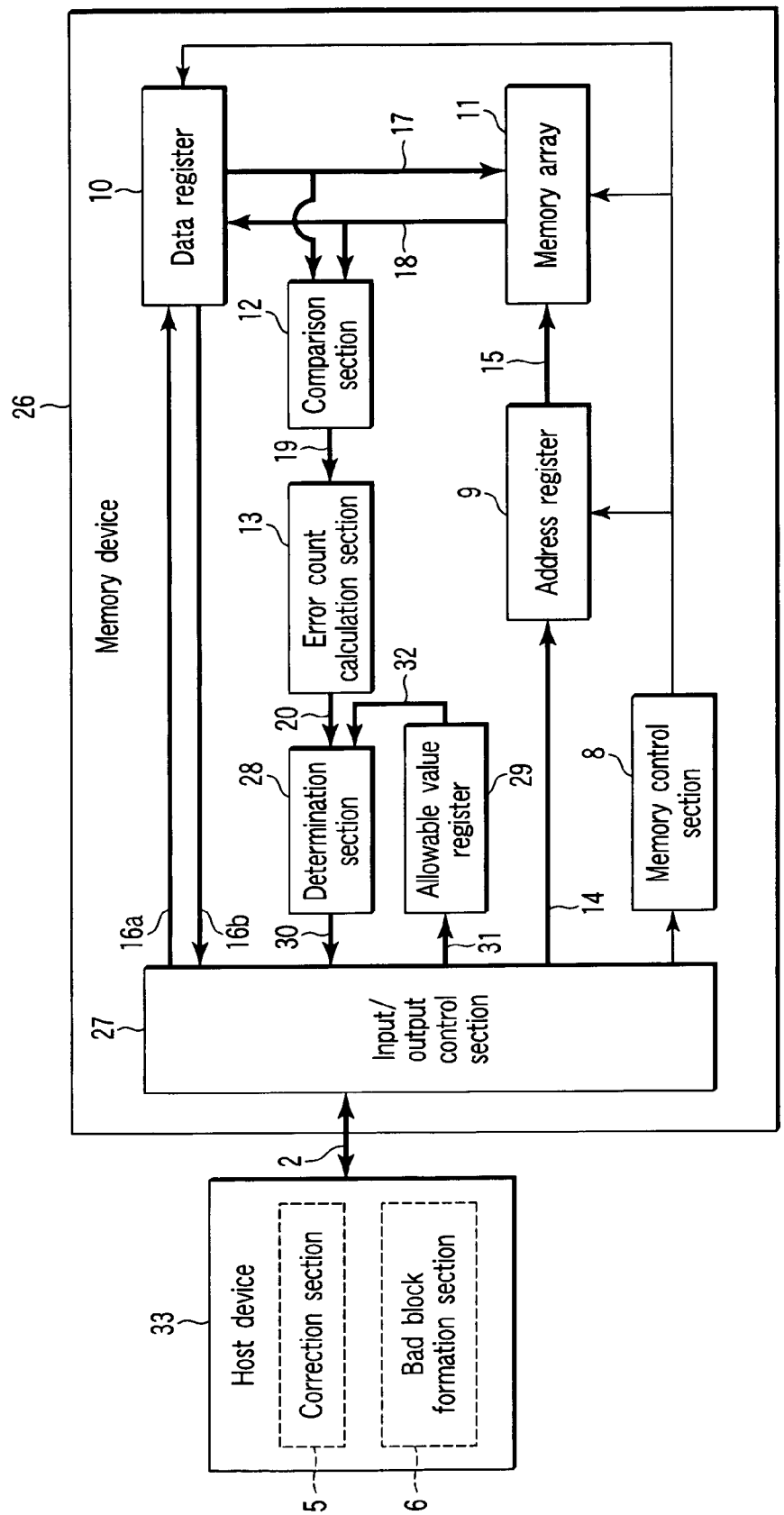
F I G. 8

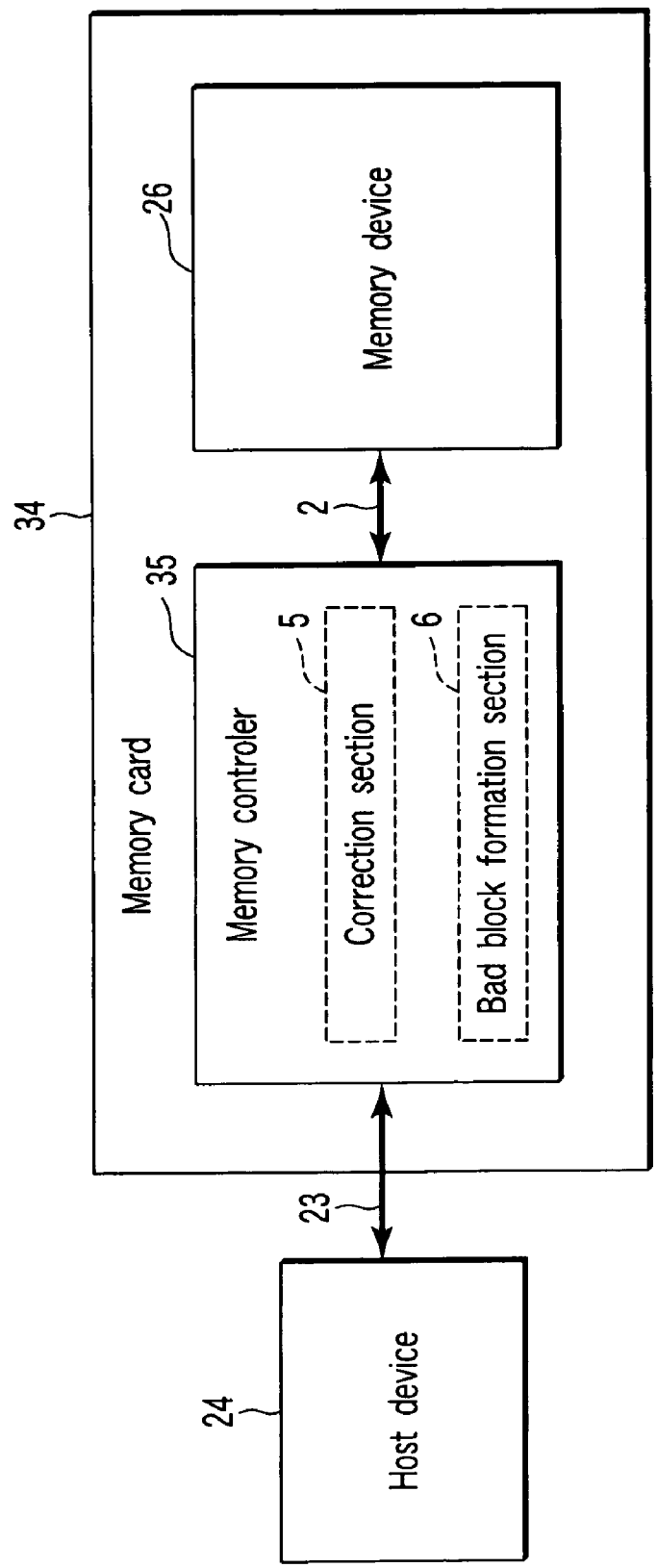
F I G. 9

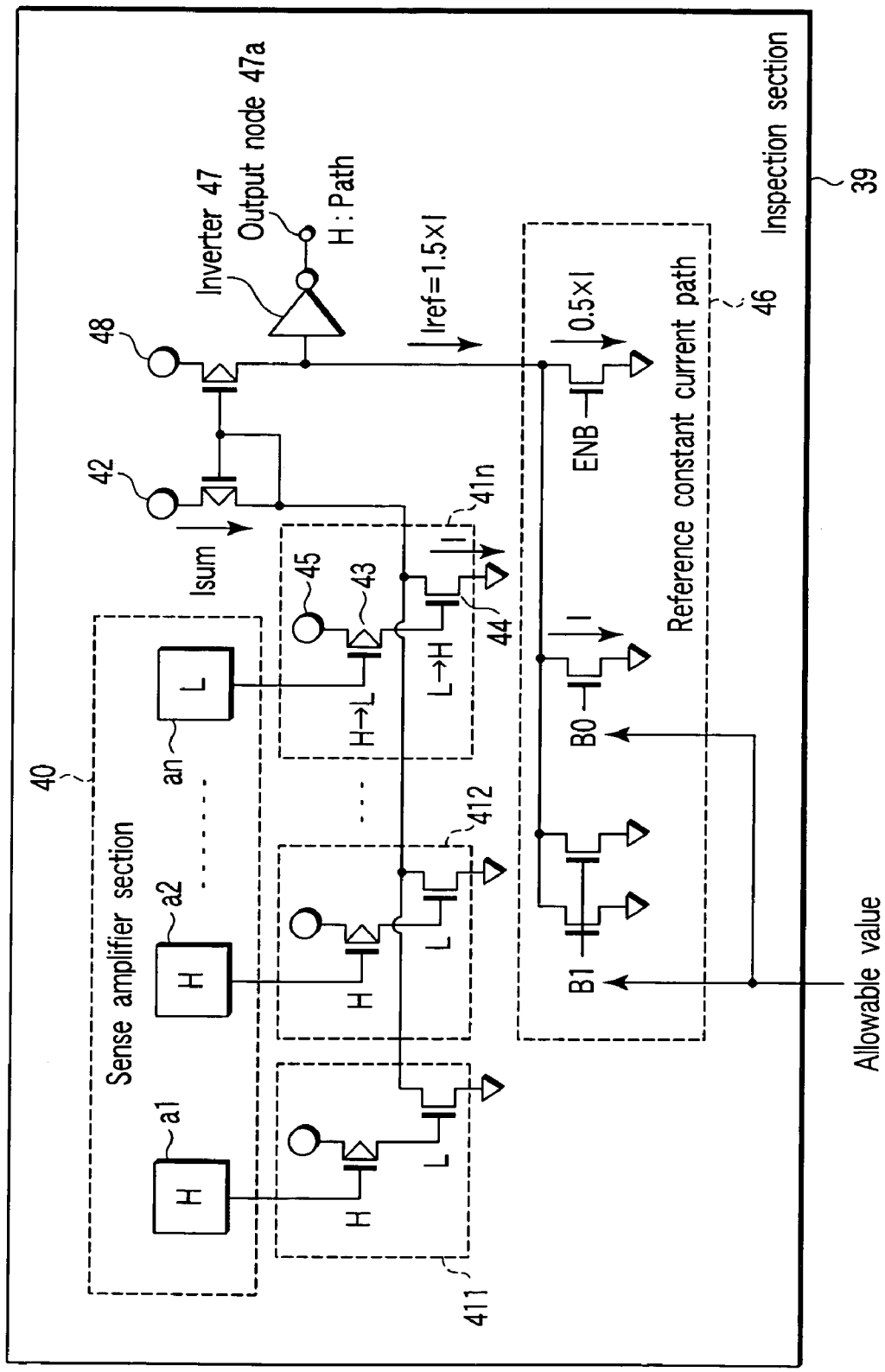
F I G. 13

MEMORY DEVICE AND MEMORY CARD

CROSS-REFERENCE TO RELATED APPLICATIONS

This application is based upon and claims the benefit of priority from prior Japanese Patent Applications No. 2003-199143, filed Jul. 18, 2003; and No. 2004-185408, filed Jun. 23, 2004, the entire contents of both of which are incorporated herein by reference.

BACKGROUND OF THE INVENTION

1. Field of the Invention

The present invention relates to a memory device and a memory card.

2. Description of the Related Art

Flash memories include NAND, NOR, and AND type memories. A SmartMedia is a kind of memory card using a NAND flash memory.

In a SmartMedia, errors may occur in data write processing or erase processing. To correct errors in a SmartMedia, ECC (Error Correction Code) is generally used. In the standard of a given SmartMedia, an error correction function with a 2-bit error detection capability and 1-bit error correction capability is used.

A flash memory has a function of indicating, by a status, whether a write or erase has normally been executed in write processing or erase processing. The status indicates only the presence/absence of errors and not the number of errors.

Document 1 (Jpn. Pat Appln. KOKAI Publication No. 5-282887, pp5, FIG. 6) discloses a memory device which makes a data block (memory block) unusable (form a bad block) when the status in write processing or erase processing indicates errors.

In the conventional SmartMedia, the number of errors generated in write processing or erase processing is not returned as a response to a write instruction or an erase instruction. Only a status representing the presence/absence of errors is returned. For this reason, it cannot be determined on the basis of the response to the write instruction or erase instruction whether the number of errors is a number correctable by the error correction function.

In the conventional SmartMedia, every time an error occurs in write processing or erase processing, a data block containing the error bit is set in the unusable state. For this reason, when unusable data blocks are accumulated, the usable capacity of the memory device in the SmartMedia decreases.

BRIEF SUMMARY OF THE INVENTION

A memory device according to a first aspect of the present invention comprises a data storage section, a section which compares in write processing, for data being target of the write processing, a state before the data is stored in the data storage section with a state of the data which is stored in the data storage section and read out from the data storage section, a section which obtains the number of errors for the write processing on the basis of a comparison result from the comparison section, and a section which returns the number of errors.

A memory device according to a second aspect of the present invention comprises a data storage section which comprises a data block being target of erase processing, a section which compares in the erase processing, for the data block, a actual state of the data block after the erase processing is executed with a theoretical data state after the erase processing is executed, a section which obtains the number of errors for the erase processing on the basis of a comparison result from the comparison section, and a section which returns the number of errors.

A memory device according to a third aspect of the present invention comprises a data storage section, a section which stores a signal representing whether a write processing for the data storage section is normally for each of units which are obtained by dividing data being target of the write processing by a predetermined data length, a section which stores an allowable value representing an allowable range of the number of abnormal signals representing that the write processing for the data storage section is abnormal, and a section which invalidates the write processing when the number of abnormal signals of the signals falls outside the allowable range, wherein the allowable value is set from outside.

A memory card according to a fourth aspect of the present invention comprises an non-volatile semiconductor memory, and a controller which executes write processing for the non-volatile semiconductor memory, wherein the non-volatile semiconductor memory comprises a data storage section, a section which compares in write processing, for data being target of the write processing, a state before the data is stored in the data storage section with a state of the data which is stored in the data storage section and read out from the data storage section, a section which obtains the number of errors for the write processing on the basis of a comparison result from the comparison section, and a section which returns the number of errors to the controller.

BRIEF DESCRIPTION OF THE SEVERAL VIEWS OF THE DRAWING

FIG. 1 is a block diagram showing an example of the arrangement of a memory device according to the first embodiment of the present invention;

FIG. 7 is a block diagram showing an example of the arrangement of a memory card according to the second embodiment of the present invention;

FIG. 8 is a block diagram showing an example of the arrangement of a memory device according to the third embodiment of the present invention;

FIG. 9 is a block diagram showing an example of the arrangement of a memory card comprising the memory device according to the third embodiment;

FIG. 13 is a circuit diagram showing an example of an inspection section.

DETAILED DESCRIPTION OF THE INVENTION

Figure 2:
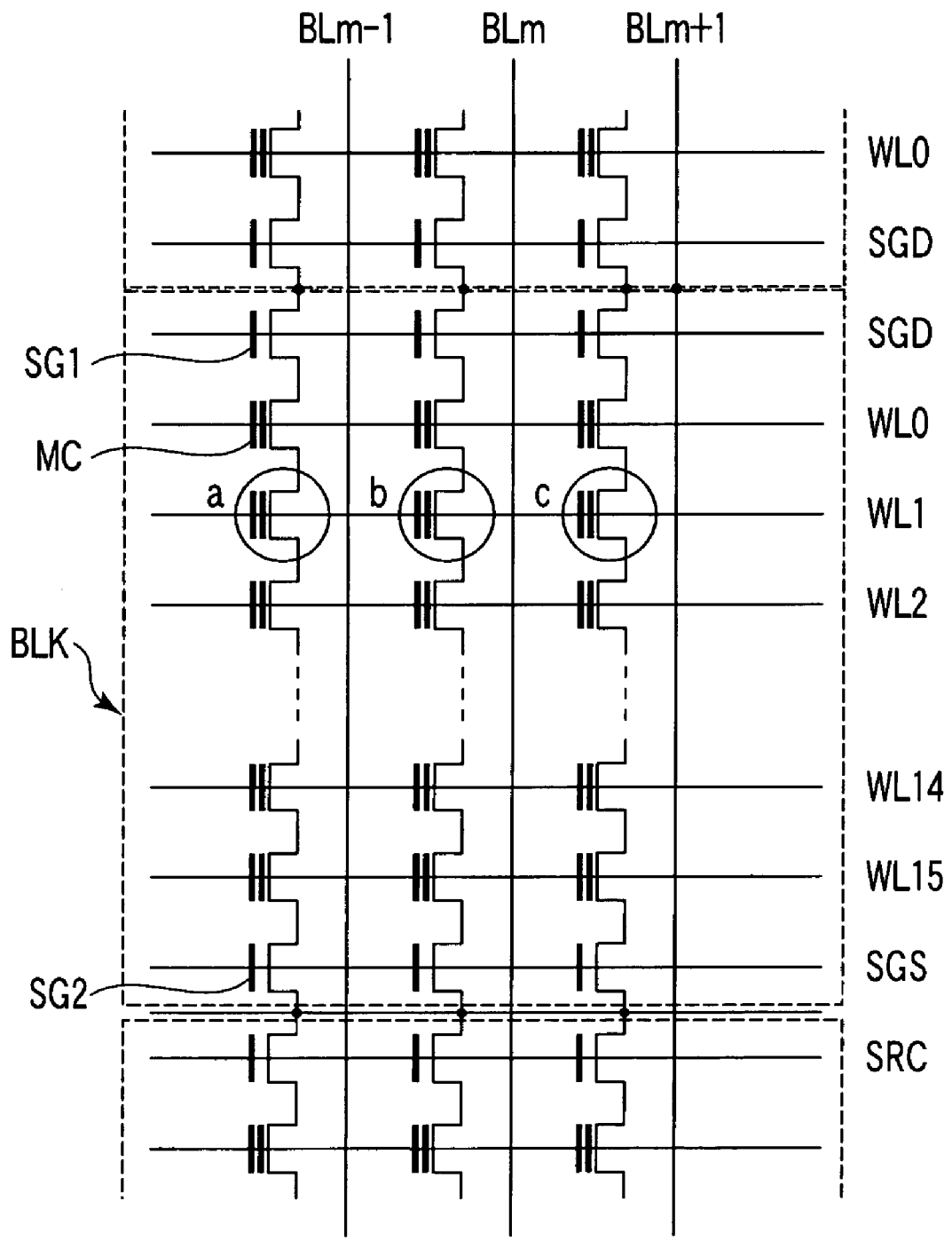
FIG. 2 is a circuit diagram showing an example of part of a memory array.

The embodiments will be described below with reference to the accompanying drawing. The same reference numerals denote the same elements throughout the drawing, and a description thereof will be omitted.

First Embodiment

In this embodiment, an example of a memory device which is directly accessed by a host device will be described.

FIG. 1 is a block diagram showing an example of the arrangement of a memory device according to the first embodiment.

A memory device 1 and a host device 3 are connected by a memory interface 2 so that they can communicate. When a data write or read is necessary, the host device 3 executes write processing, erase processing, or read processing for the memory device 1 in accordance with a communication section corresponding to the memory interface 2.

In the write processing, the host device 3 provides address information and write data containing a write instruction and ECC to the memory device 1.

In the erase processing, the host device 3 provides an erase instruction and address information to the memory device 1.

In the read processing, the host device 3 provides a read instruction and address information to the memory device 1 and reads out read data containing ECC.

The host device 3 comprises a determination section 4, correction section 5, and bad block formation section 6.

In the write processing or erase processing, the determination section 4 receives the number of error bits from the memory device 1 as a response to the write instruction or the erase instruction. When the number of error bits is equal to or smaller than the error-correctable number, the determination section 4 determines the write or erase as valid. When the number of error bits exceeds the error-correctable number, the determination section 4 determines the write or erase as invalid.

When an error occurs in the read data, the correction section 5 executes correction on the basis of the ECC code contained in the read data.

When the determination section 4 determines the write or erase as invalid, the bad block formation section 6 changes the corresponding data block (a region indicated by the designed address information in the example shown in FIG. 1) in the write processing or erase processing to a bad block.

On the other hand, when the determination section 4 determines the write or erase as valid, the bad block formation section 6 maintains the usable state of the corresponding data block.

The memory device 1 is controlled by the host device 3 and executes a data write, read, and erase. In the write processing or the erase processing, the memory device 1 returns, to the host device 3, the number of error bits in data which could not normally be written or erased.

The memory device 1 comprises an input/output control section 7, memory control section 8, address register 9, data register 10, memory array 11, comparison section 12, and error count calculation section 13.

The input/output control section 7 and host device 3 are connected by the memory interface 2. The input/output control section 7 and address register 9 are connected by an interface 14. The address register 9 and memory array 11 are connected by an interface 15.

The input/output control section 7 and data register 10 are connected by interfaces 16a and 16b. The data register 10, memory array 11, and comparison section 12 are connected by a write interface 17 and read interface 18.

The write interface 17 provides the write data from the data register 10 to the memory array 11 and comparison section 12. The read interface 18 provides the read data from the memory array 11 to the data register 10. The read interface 18 also provides write data after the write or the value of a corresponding data block after the data erase from the memory array 11 to the comparison section 12.

The comparison section 12 and error count calculation section 13 are connected by an interface 19. The error count calculation section 13 and input/output control section 7 are connected by an interface 20.

The input/output control section 7 interprets an instruction received from the host device 3 via the memory interface 2 and provides instruction interpretation data representing the interpretation result to the memory control section 8.

Upon receiving the write instruction, the input/output control section 7 receives the write data and the address information from the host device 3 via the memory interface 2. The input/output control section 7 provides the address information to the address register 9 via the interface 14 and the write data to the data register 10 via the interface 16a.

Upon receiving the read instruction, the input/output control section 7 receives the address information from the host device 3 via the memory interface 2. The input/output control section 7 provides the address information to the address register 9 via the interface 14. The input/output control section 7 receives the read data from the data register 10 via the interface 16b and provides the read data to the host device 3 via the memory interface 2.

Upon receiving the erase instruction, the input/output control section 7 receives the address information from the host device 3 via the memory interface 2 and provides the address information to the address register 9 via the interface 14.

In the write processing or the erase processing, the input/output control section 7 receives the number of error bits from the error count calculation section 13 via the interface 20 and provides the number of error bits to the host device 3 via the memory interface 2.

The memory control section 8 receives the instruction interpretation data that indicates one of the write, read, and erase from the input/output control section 7 and controls the address register 9, data register 10, and memory array 11 to execute one of the write, read, and erase processing corresponding to the contents of the instruction interpretation data.

The memory control section 8 controls, e.g., the operation timings of the address register 9, data register 10, and memory array 11.

The address register 9 stores the address information received from the input/output control section 7 via the interface 14 and provides the address to be accessed to the memory array 11 via the interface 15.

In the write processing, the data register 10 stores the write data received from the input/output control section 7 via the interface 16a and provides the write data to the memory array 11 and comparison section 12 via the write interface 17.

In read processing, the data register 10 stores the read data received from the memory array 11 via the read interface 18 and provides the read data to the input/output control section 7 via the interface 16b.

In the write processing, the memory array 11 stores the write data received from the data register 10 via the write interface 17 in accordance with the address received from the address register 9 via the interface 15. In addition, the memory array 11 provides the write data after the write to the comparison section 12 via the read interface 18. The write data after the write is stored in the memory array 11 and read out from the memory array 11.

In the read processing, the memory array 11 provides the read data stored at the address received from the address register 9 via the interface 15 to the data register 10 via the read interface 18.

In the erase processing, the memory array 11 erases data stored at the address received from the address register 9 via the interface 15. The memory array 11 provides, to the comparison section 12 via the read interface 18, the value of the data block after the data corresponding to the received address is erased. As the memory array 11, for example, a NAND memory cell array is used.

In the write processing, the comparison section 12 receives the write data before the write, which is provided from the data register 10 to the memory array 11, and the write data after the write from the memory array 11.

In the write processing, the comparison section 12 compares the write data before the write with the write data after the write and provides error bit information representing coincidence/incoincidence of bits to the error count calculation section 13 via the interface 19.

In the erase processing, the comparison section 12 receives the value of the data block after the data erase from the memory array 11. The comparison section 12 compares the value of the data block with a theoretical value representing a normal data erase state and provides the error bit information representing coincidence/incoincidence of bits to the error count calculation section 13 via the interface 19.

An example of the theoretical value representing the normal data erase state is a value whose all bits are "1"s. In this case, a "0" bit in the data block after the data erase is determined as a bit that does not coincide with the theoretical value for normal erase.

In the write processing or erase processing, the error count calculation section 13 obtains the number of error bits, which indicates the number of bit incoincidence, on the basis of the error bit information received from the comparison section 12 via the interface 19 and provides the number of error bits to the input/output control section 7 via the interface 20. As described above, the input/output control section 7 provides the number of error bits to the host device 3 via the memory interface 2 as the response to the write instruction or erase instruction.

FIG. 2 is a circuit diagram showing an example of part of the memory array 11.

In the memory array 11, a plurality of NAND cells are arranged. One NAND cell comprises memory cells MC including, e.g., 16 EEPROMs connected in series and first and second selection gates SG1 and SG2.

The first selection gate SG1 is connected to a bit line BLm-1. The second selection gate SG2 is connected to a source line SRC.

The control gates of the memory cells arranged in the rows are commonly connected to the word lines WL0, WL1, WL2, . . . , WL15.

The first selection gate SG1 is commonly connected to a select line SGD. The second selection gate SG2 is commonly connected to a select line SGS.

The memory array 11 includes a plurality of blocks BLK, as indicated by the broken line. Each block includes a plurality of NAND cells. In the memory array 11, data is erased for each block.

Figure 3:
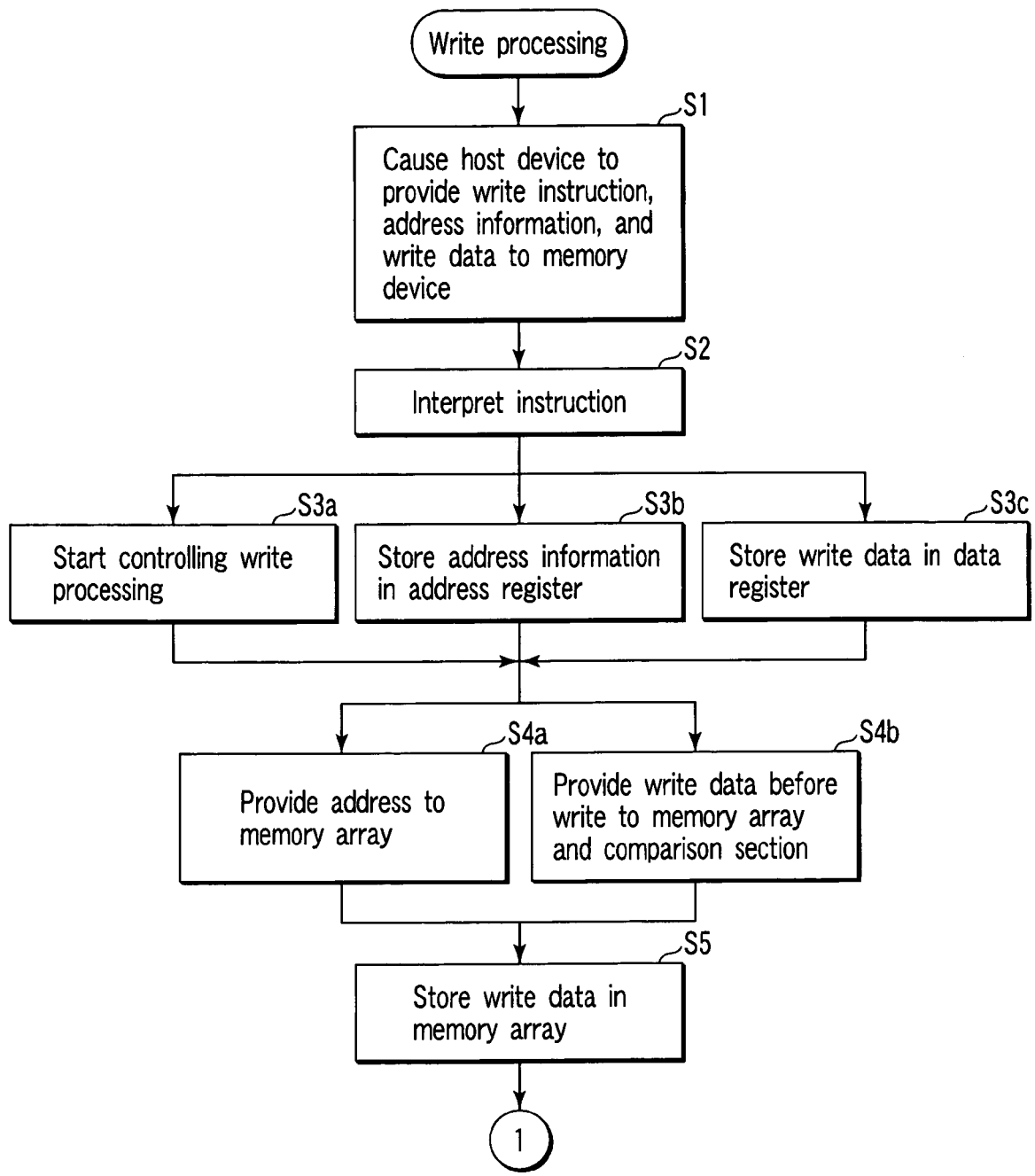
FIG. 3 is a flowchart showing an example of the first half of write processing by the memory device and host device according to the first embodiment.

FIG. 3 is a flowchart showing an example of the first half of the write processing by the memory device 1 and host device 3 according to this embodiment. FIG. 3 shows an example of processing until the write data is stored in the memory array 11.

Figure 4:
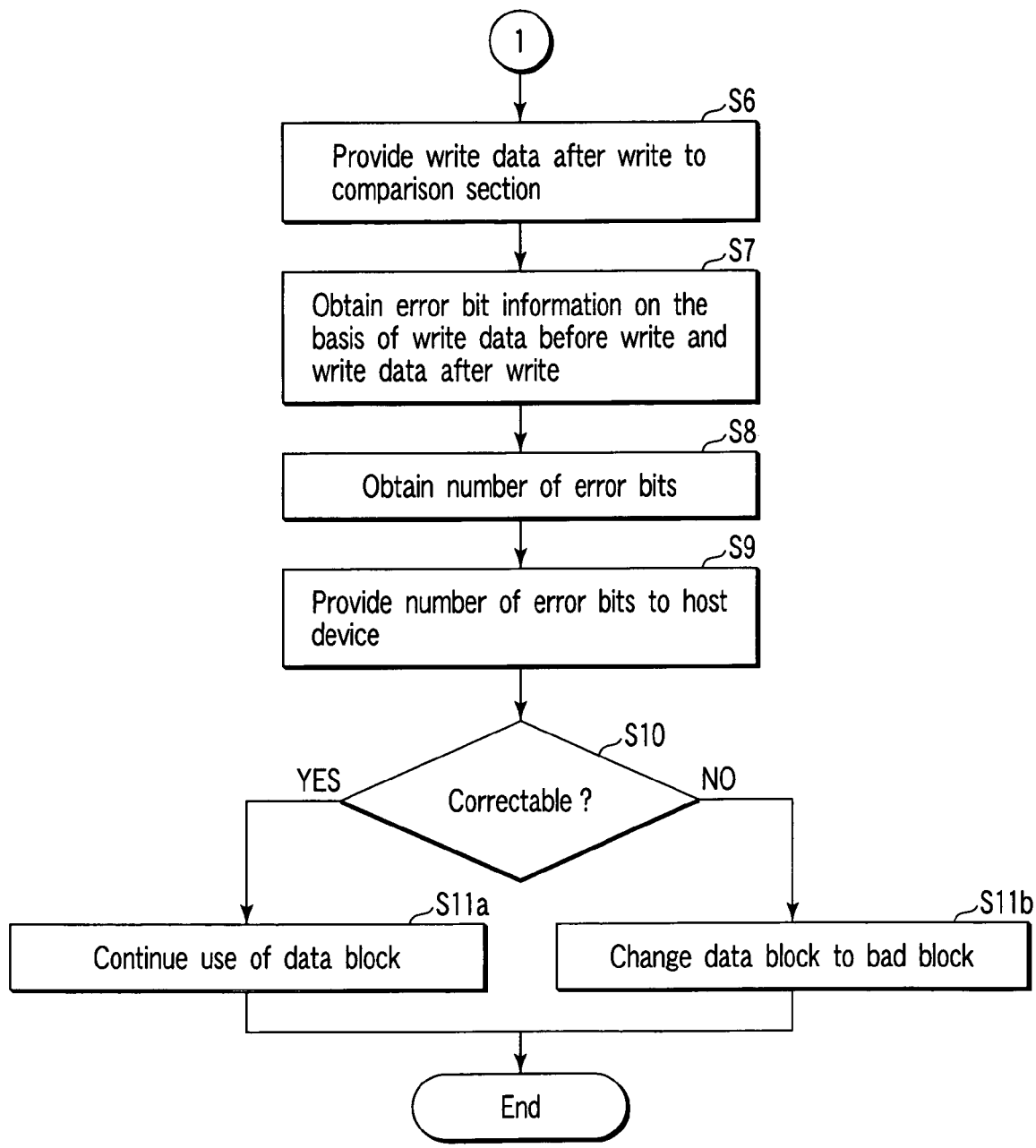
FIG. 4 is a flowchart showing an example of the second half of write processing by the memory device and host device according to the first embodiment.

FIG. 4 is a flowchart showing an example of the second half of the write processing by the memory device 1 and host device 3 according to this embodiment. FIG. 4 shows an example of processing after the write data is stored in the memory array 11.

In step S1, the host device 3 provides the write instruction, address information, and write data containing ECC for error correction to the input/output control section 7 of the memory device 1. The input/output control section 7 receives the write instruction, address information, and the write data to be written from the host device 3.

In step S2, the input/output control section 7 interprets the instruction and provides the instruction interpretation data indicating the write to the memory control section 8.

In step S3a, the memory control section 8 starts control corresponding to the write processing in accordance with the contents of the instruction interpretation data.

In step S3b, the input/output control section 7 provides the address information to the address register 9. The address register 9 stores the address information.

In step S3c, the input/output control section 7 provides the write data to the data register 10. The data register 10 stores the write data.

The execution order of steps S3a to S3c can freely be set.

In step S4a, the address register 9 provides the address to the memory array 11.

In step S4b, the data register 10 provides the write data before the write to the memory array 11 and comparison section 12.

The execution order of steps S4a and S4b can freely be set.

In step S5, the memory array 11 stores the write data received from the data register 10 at the address received from the address register 9.

In step S6, the memory array 11 provides the write data after the write to the comparison section 12.

In step S7, the comparison section 12 compares the write data before the write with the write data after the write, obtains the error bit information representing coincidence/incoincidence, and provides the error bit information to the error count calculation section 13.

In step S8, the error count calculation section 13 obtains the number of error bits on the basis of the error bit information and provides the number of error bits to the input/output control section 7.

In step S9, the input/output control section 7 provides the number of error bits to the host device 3 as the response to the write instruction.

In step S10, the determination section 4 of the host device 3 determines whether the number of error bits is equal to or smaller than the number correctable by the ECC contained in the write data.

If YES in step S10, the bad block formation section 6 maintains the usable state of the data block in step S11a.

If NO in step S10, the bad block formation section 6 changes the data block to the bad block in step S11b.

Figure 5:
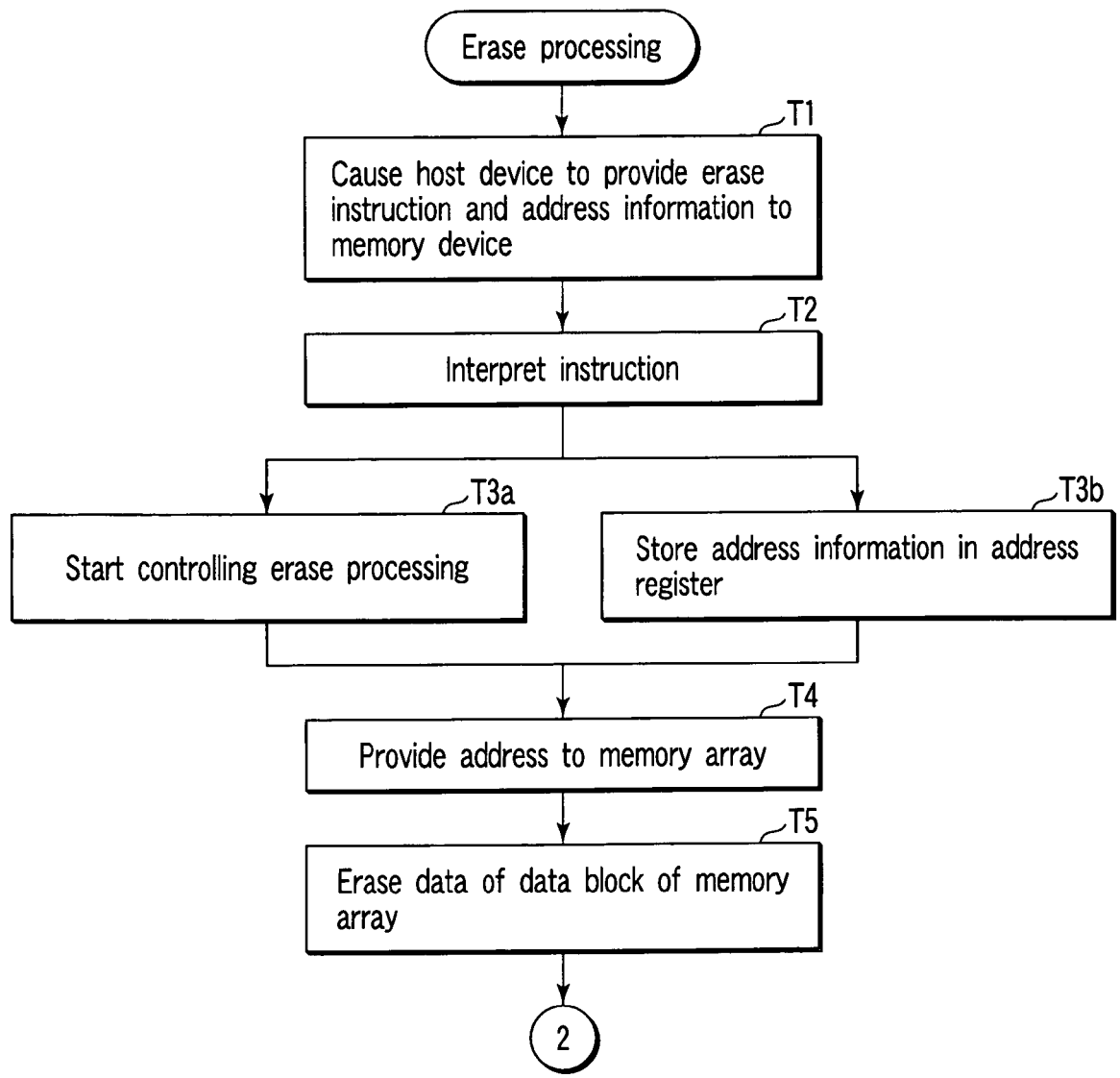
FIG. 5 is a flowchart showing an example of the first half of erase processing by the memory device and host device according to the first embodiment.

FIG. 5 is a flowchart showing an example of the first half of the erase processing by the memory device 1 and host device 3 according to this embodiment. FIG. 5 shows an example of processing until data is erased from the memory array 11.

Figure 6:
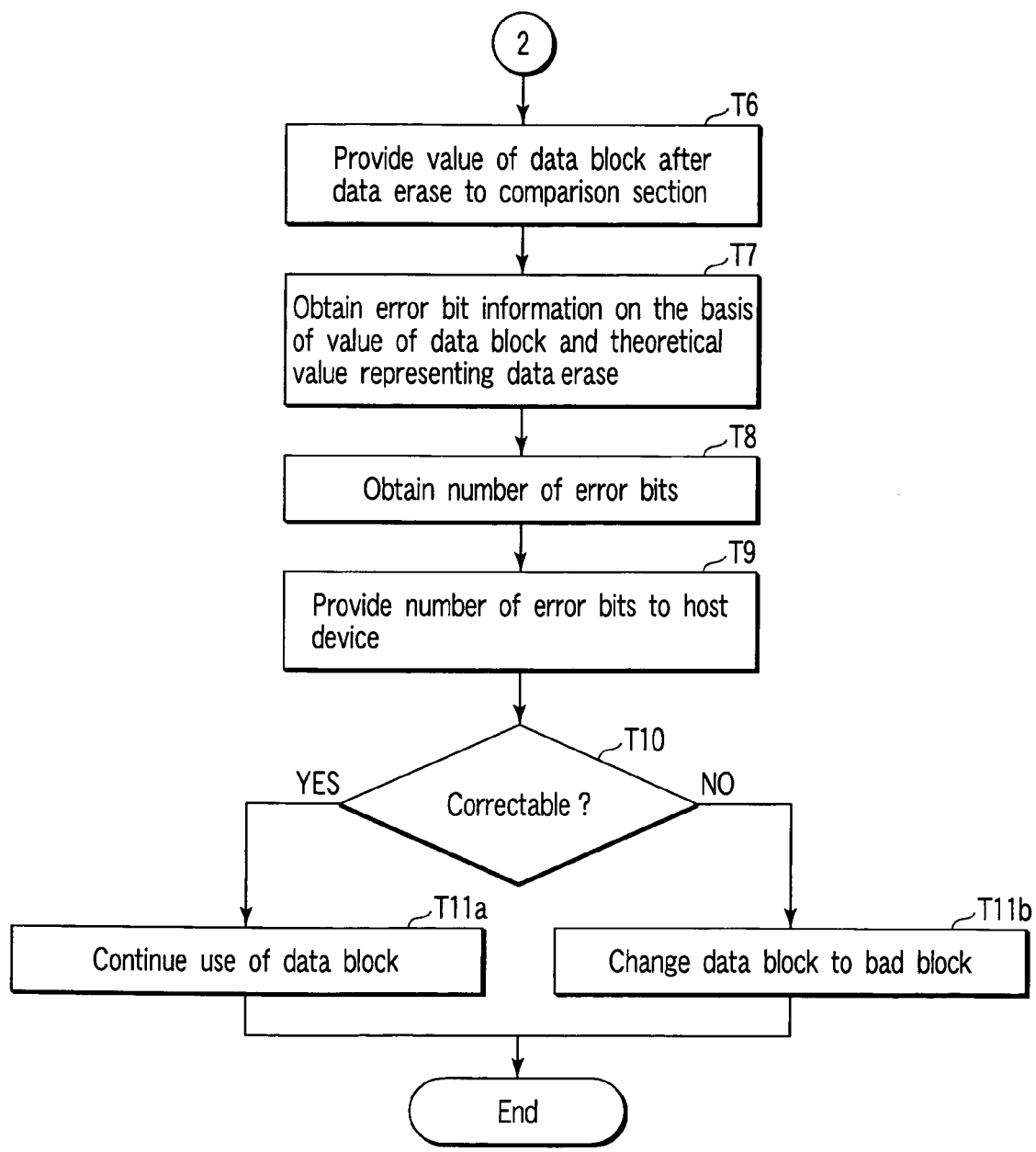
FIG. 6 is a flowchart showing an example of the second half of erase processing by the memory device and host device according to the first embodiment.

FIG. 6 is a flowchart showing an example of the second half of the erase processing by the memory device 1 and host device 3 according to this embodiment. FIG. 6 shows an example of processing after data is erased from the memory array 11.

In step T1, the host device 3 provides the erase instruction and address information to the input/output control section 7 of the memory device 1. The input/output control section 7 receives the erase instruction and address information from the host device 3.

In step T2, the input/output control section 7 interprets the instruction and provides the instruction interpretation data indicating the erase to the memory control section 8.

In step T3a, the memory control section 8 starts control corresponding to the erase processing in accordance with the contents of the instruction interpretation data.

In step T3b, the input/output control section 7 provides the address information to the address register 9. The address register 9 stores the address information.

The execution order of steps S3a and S3b can freely be set.

In step T4, the address register 9 provides the address to the memory array 11.

In step T5, the memory array 11 erases data of the data block corresponding to the address received from the address register 9.

In step T6, the memory array 11 provides the value of the data block after the data erase to the comparison section 12.

In step T7, the comparison section 12 compares the value of the data block after the data erase and the theoretical value representing the normal data erase state, obtains the error bit information representing coincidence/incoincidence, and provides the error bit information to the error count calculation section 13.

In step T8, the error count calculation section 13 obtains the number of error bits on the basis of the error bit information and provides the number of error bits to the input/output control section 7.

In step T9, the input/output control section 7 provides the number of error bits to the host device 3 as the response to the erase instruction.

In step T10, the determination section 4 of the host device 3 determines whether the number of error bits is equal to or smaller than the correctable number.

If YES in step T10, the bad block formation section 6 maintains the usable state of the data block in step T11a.

If NO in step T10, the bad block formation section 6 changes the data block to the bad block in step T11b.

The effect obtained by the memory device 1 according to the above-described embodiment will be described below.

A conventional flash memory returns only a status which indicates the presence/absence of errors in response to a write instruction or erase instruction in write processing or erase processing. For this reason, a conventional host device cannot recognize the number of error bits in the write processing or erase processing and therefore cannot determine whether the number of error bits falls within the correctable range. In the conventional flash memory, even when the number of errors which occur in a data block is a correctable number, the data block is changed to a bad block, and the memory capacity decreases.

In the memory device 1 according to this embodiment, the number of error bits is returned to the host device 3 in the write processing or erase processing. If the number of error bits from the memory device 1 is equal to or smaller than the number correctable by ECC, the host device 3 continues to use the data block.

Hence, in this embodiment, when the number of errors is a correctable number, the data block in the memory device can be prevented from being changed to the bad block, and any decrease in memory capacity of the memory device can be prevented.

In this embodiment, when the write data or read data contains ECC code with a high error correction capability, a bad block formation can more effectively be prevented, and the decrease in memory capacity can more effectively be prevented.

For example, as another method of obtaining the number of errors which have occurred in the write processing or erase processing, to obtain the number of errors, the host device that controls the memory device may read the whole data block and confirm the errors after the write processing or erase processing. In this method, however, since the operation of reading the entire data block is necessary, the operation speed decreases. When the memory device 1 according to this embodiment is used, the number of errors which have occurred in the write processing or erase processing can be obtained while preventing the decrease in operation speed.

Second Embodiment

In this embodiment, an example of a memory card comprising the memory device 1 according to the first embodiment will be described.

FIG. 7 is a block diagram showing an example of the arrangement of a memory card according to this embodiment.

A memory card 21 is a kind of flash memory and comprises a memory controller 22 and the memory device 1. A memory card interface 23 allows a host device 24 to communicate with the memory controller 22. A memory interface 2 allows the memory controller 22 to communicate with the memory device 1.

The host device 24 accesses the memory device 1 through the memory controller 22 that controls the memory device 1. When a data write or read for the memory card 21 is necessary, the host device 24 executes processing for the write or read for the memory card 21 in accordance with a communication section 24a corresponding to the memory card interface 23.

The host device 24 executes general processing for a data write or read.

More specifically, in the write processing, the host device 24 provides the write instruction, address information, and write data to the memory controller 22 of the memory card 21. In the write processing, the host device 24 also receives, from the memory controller 22, data representing the write is valid or invalid.

In the read processing, the host device 24 provides the read instruction and address information to the memory controller 22 and receives the read data from the memory controller 22.

In the write processing or read processing, the memory card 21 is accessed by the host device 24 via the memory card interface 23.

The memory controller 22 executes processing for the write or read for the memory device 1 in accordance with the write instruction or the read instruction received from the host device 24.

In the write processing, the memory controller 22 receives the write instruction, address information, and write data containing ECC from the host device 24, converts the address information as needed, and provides the write instruction, converted address information, and write data containing ECC to the memory device 1. The memory controller 22 manages the correspondence between address information provided from the host device 24 to the memory card 21 and address information provided from the memory controller 22 to the memory device 1.

In the read processing, the memory controller 22 receives the read instruction and address information from the host device 24, converts the address information as needed, and provides the read instruction and converted address information to the memory device 1. The memory controller 22 also receives the read data containing ECC from the memory device 1 and provides the read data to the host device 24.

In this embodiment, the memory controller 22 sometimes executes not only the write processing but also the erase processing for the memory device 1 in accordance with the write instruction received from the host device 24. When the erase processing is to be executed for the memory device 1, the memory controller 22 provides the erase instruction and address information to the memory device 1.

When the write processing or erase processing is executed for the memory device 1, the memory controller 22 receives the number of error bits from the memory device 1 as the response.

The memory controller 22 comprises a correction section 5, bad block formation section 6, and determination section 25.

In the write processing or erase processing, the determination section 25 receives the number of error bits as the response from the memory device 1 for the write instruction or erase instruction and determines on the basis of the number of error bits whether the write or erase is valid or invalid. The determination section 25 creates determination data that indicates the determination result.

When the determination data indicates "valid", the memory controller 22 provides data representing that the write or erase is valid to the host device 24.

When the determination data indicates "invalid", the memory controller 22 executes processing for retrying the write or erase in an attempt to solve the anomaly in the memory card 21.

If the anomaly cannot be solved in the memory card 21, the memory controller 22 provides data representing that the write or erase is invalid to the host device 24.

If the anomaly can be solved in the memory card 21, the memory controller 22 provides data representing that the write or erase is valid to the host device 24.

In the first embodiment, the memory device 1 is directly controlled by the host device 3. In the second embodiment, the memory device 1 is controlled by the memory controller 22. More specifically, in this embodiment, the memory device 1 execute a data write, read, or erase under the control of the memory controller 22 and provides the number of error bits which are generated in the write processing or erase processing to the memory controller 22.

When the memory card 21 according to this embodiment is used, characteristic control for the memory device 1 is executed by the memory controller 22 in the memory card 21. Hence, the host device 24 can obtain the same effect as in the first embodiment without changing the existing arrangement.

Third Embodiment

In this embodiment, an example will be described in which a determination section having the same function as that of the determination sections 4 and 25 of the first and second embodiments is added to the memory device.

FIG. 8 is a block diagram showing an example of the arrangement of a memory device according to this embodiment.

A memory device 26 comprises an input/output control section 27 including an allowable value setting function in place of the input/output control section 7 of the memory device 1 according to the first embodiment.

The memory device 26 also comprises a determination section 28 and allowable value register 29. The determination section 28 is connected to an error count calculation section 13 by an interface 20 and connected to the input/output control section 27 by an interface 30. The allowable value register 29 is connected to the input/output control section 27 by an interface 31 and connected to the determination section 28 by an interface 32.

A host device 33 is connected to the memory device 26 by the memory interface 2. The host device 33 comprises the correction section 5 and bad block formation section 6.

The host device 33 provides an allowable value representing the number of error bits correctable by the correction section 5 to the input/output control section 27 of the memory device 26.

The input/output control section 27 provides the allowable value received from the host device 33 to the allowable value register 29.

The allowable value register 29 stores the allowable value received from the input/output control section 27 and provides the allowable value to the determination section 28.

The determination section 28 compares the number of error bits received from the error count calculation section 13 with the allowable value received from the allowable value register 29. When the number of error bits is equal to or smaller than the allowable value, the write or erase is determined as valid. When the number of error bits exceeds the allowable value, the write or erase is determined as invalid.

The determination section 28 provides determination data to the input/output control section 27.

The input/output control section 27 provides the determination data received from the determination section 28 to the host device 33.

When the read data has errors, the correction section 5 of the host device 33 corrects the read data on the basis of ECC.

When the determination data indicates "invalid", the bad block formation section 6 changes the data block of the write processing or erase processing to the bad block.

When the determination data indicates "valid", the bad block formation section 6 maintains the usable state of the data block.

The remaining operation of the input/output control section 27 is the same as that of the input/output control section 7 according to the first embodiment, and a description thereof will be omitted.

FIG. 9 is a block diagram showing an example of the arrangement of a memory card comprising the memory device according to this embodiment.

A memory card 34 is a kind of flash memory and comprises a memory controller 35 and the memory device 26.

The memory controller 35 has the similar function as that of the memory controller 22 according to the second embodiment. As a characteristic feature, the memory controller 35 sets an allowable value in the allowable value register 29 of memory device 26 and does not comprise the determination section 25.

The bad block formation section 6 determines in accordance with the determination data received from the memory device 26 whether the data block is to be changed to the bad block.

When the determination data received from the memory device 26 indicates "valid", the memory controller 35 provides data representing that the write or erase is valid to the host device 24.

When the determination data indicates "invalid", the memory controller 35 executes processing for retrying the write or erase in an attempt to solve the anomaly in the memory card 21.

If the anomaly cannot be solved in the memory card 21, the memory controller 35 provides data representing that the write or erase is invalid to the host device 24.

If the anomaly can be solved in the memory card 21, the memory controller 35 provides data representing that the write or erase is valid to the host device 24.

When the memory device 26 according to this embodiment is used, it is determined in the memory device 26 whether the number of error bits is equal to or smaller than the correctable number. If the errors are correctable, the data block can be prevented from being changed to a bad block.

In the above embodiments, the memory device 1 or 26 returns the number of error bits as the response to the write instruction or erase instruction.

However, the memory device 1 or 26 may return the number of other errors. It may be determined whether number of errors is a correctable number. Only when the errors are uncorrectable, the data block may be changed to the bad block.

Figure 10:
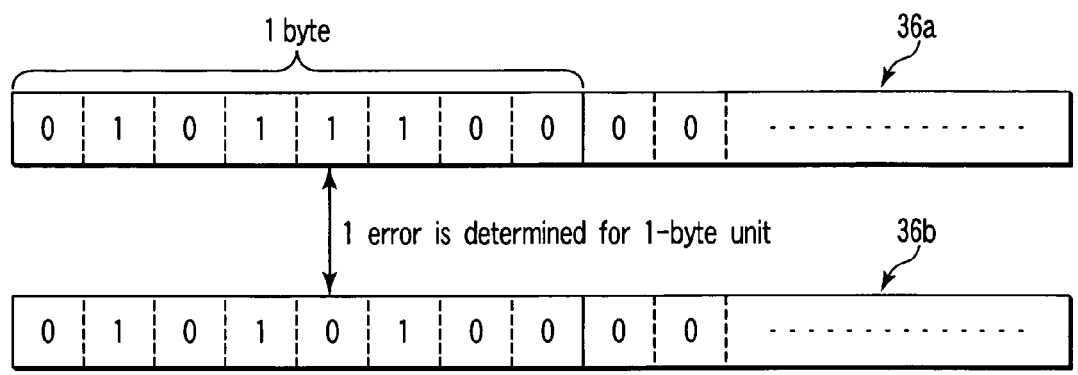
FIG. 10 is a view showing a state in which two data blocks to be compared are divided into 1-byte units.

For example, as shown in FIG. 10, the memory device 1 or 26 may divide two data blocks 36a and 36b to be compared into 1-byte units and return the number of error bytes representing the number of 1-byte units having errors.

In this case, when bits in a given byte unit include one or more bits with errors, it is determined that the byte unit has errors.

Figure 11:
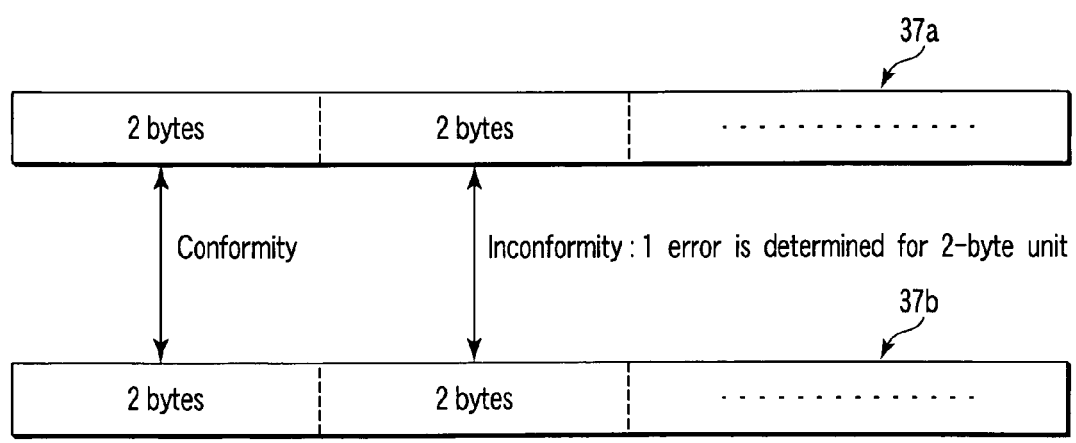
FIG. 11 is a view showing a state in which two data blocks to be compared are divided into 2-byte units.

Alternatively, for example, as shown in FIG. 11, the memory device 1 or 26 may divide two data blocks 37a and 37b to be compared into 2-byte units and return the number of 2-byte units having errors.

In this case, when bits in a 2-byte unit include one or more bits with errors, it is determined that the 2-byte unit has errors.

The comparison unit is not limited to 1 bit, 1 byte, or 2 bytes. The number of errors may be obtained on the basis of another data unit.

In the above embodiments, the layout of the constituent elements may be changed as long as they can implement the same operation as described above. The constituent elements may freely be combined or freely be divided. Several constituent elements may be omitted.

For example, the comparison section 12 and error count calculation section 13 may be integrated to form one constituent element. That is, the above embodiments are not limited to the above-described arrangements, and various changes and modifications of the constituent elements can be made within the spirit and scope of the present invention.

Fourth Embodiment

In this embodiment, a modification of the memory device 26 according to the third embodiment will be described.

Figure 12:
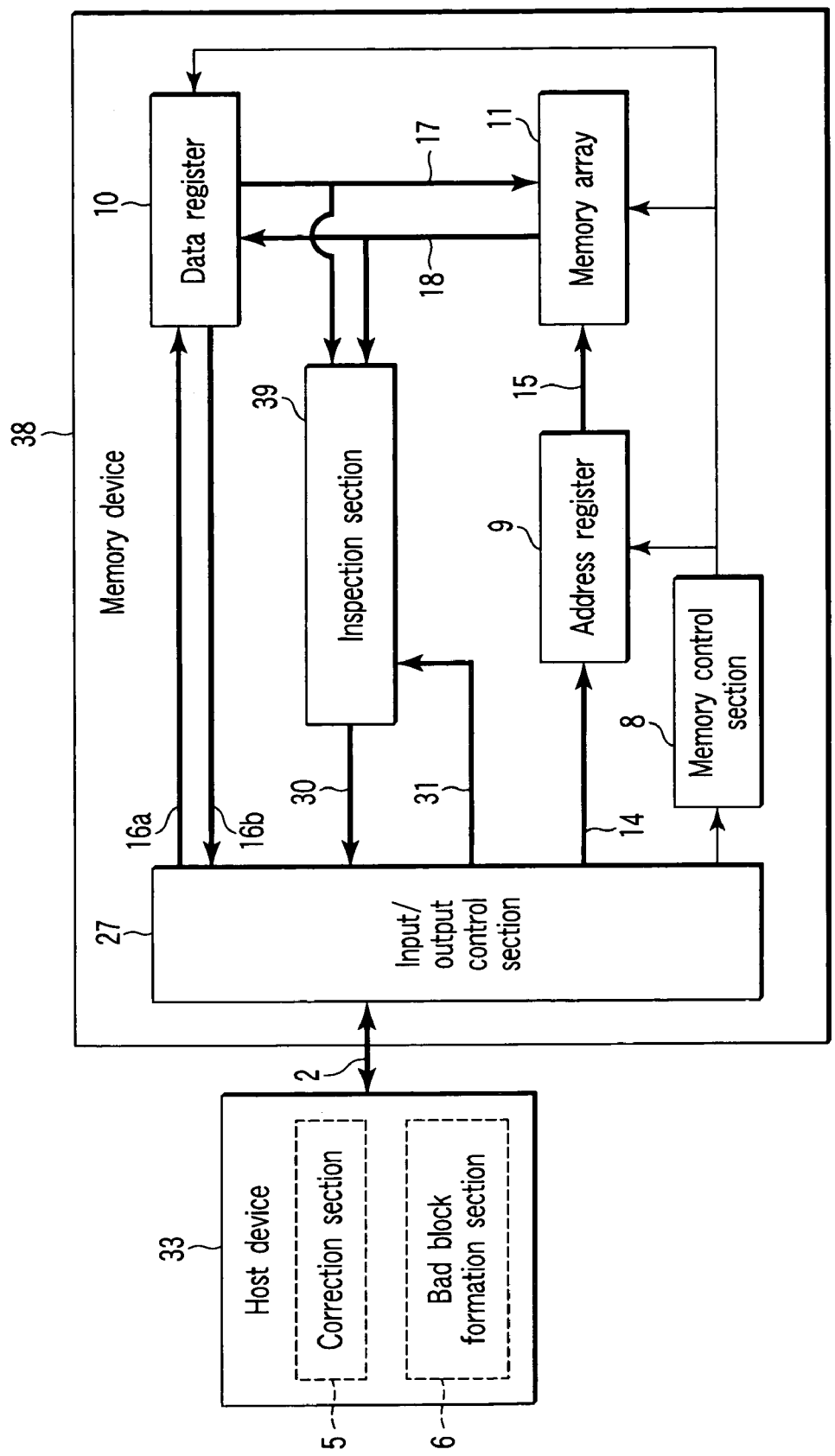
FIG. 12 is a block diagram showing an example of the arrangement of a memory device according to the fourth embodiment of the present invention.

FIG. 12 is a block diagram showing an example of the arrangement of a memory device according to the this embodiment.

A memory device 38 comprises an inspection section 39 in place of the comparison section 12, error count calculation section 13, determination section 28, allowable value register 29, and interfaces 19, 20, 30, and 32 of the memory device 26 according to the third embodiment. The inspection section 39 and the input/output control section 27 are connected by the interfaces 30 and 31.

The inspection section 39 receives the allowable value representing the number of error bits correctable by the correction section 5 from the input/output control section 27 via the interface 31.

The inspection section 39 also stores a signal representing whether data to be written is normally stored in the memory array 11 for each of data units which are obtained by dividing the data to be written by a predetermined data length. If a given comparison unit is normally stored in the memory array 11, a normal signal is stored in the inspection section 39 in correspondence with the comparison unit. On the other hand, if a given comparison unit is abnormally stored in the memory array 11, an abnormal signal is stored in the inspection section 39 in correspondence with the comparison unit.

When the number of abnormal signals stored exceeds the allowable value, the inspection section 39 provides determination data indicating "invalid" to the input/output control section 27 via the interface 30.

FIG. 13 is a circuit diagram showing an example of the inspection section 39.

A sense amplifier section 40 stores signals a1 to an representing whether the data to be written is normally stored in the memory array 11 for each of n units which are obtained by dividing the data to be written into n units. The signals a1 to an are normal signals "H" or abnormal signals "L".

The sense amplifier section 40 may have a structure formed by connecting in parallel a plurality of sense amplifiers (latches) corresponding to one page length.

Switch circuits 411 to 41n are arranged for the n units. Each of the switch circuits 411 to 41n is turned on when the signal is the abnormal signal "L" and off for a normal signal.

The current inflow sides of the switch circuits 411 to 41n receive a current from a common power supply 42. The current outflow sides of the switch circuits 411 to 41n are grounded. The switch circuits 411 to 41n supply the current from the common power supply 42 to the ground sides when the signals a1 to an are abnormal signals "L".

The switch circuit 41n that represents the switch circuits 411 to 41n will be described.

The switch circuit 41n implements a switching operation by an PMOS transistor 43, NMOS transistor 44, and power supply 45.

The gate of the PMOS transistor 43 receives the signal an for a corresponding unit. The source of the PMOS transistor 43 is connected to the power supply 45. The drain of the PMOS transistor 43 is connected to the gate of the NMOS transistor 44.

The gate of the NMOS transistor 44 is connected to the drain of the PMOS transistor 43. The drain of the NMOS transistor 44 is connected to the common power supply 42. The source of the NMOS transistor 44 is grounded.

When the signal an is the normal signal "H", the PMOS transistor 43 is turned off. The current from the power supply 45 does not flow from the source to the drain of the PMOS transistor 43.

For this reason, the gate of the NMOS transistor 44 receives "L". Accordingly, the NMOS transistor 44 is turned off. The current from the common power supply 42 does not flow from the drain to the source of the NMOS transistor 44.

On the other hand, when the signal an is the abnormal signal "L", the PMOS transistor 43 is turned on. The current from the power supply 45 flows from the source to the drain of the PMOS transistor 43.

For this reason, the gate of the NMOS transistor 44 receives "H". Accordingly, the NMOS transistor 44 is turned on. The current from the common power supply 42 flows from the drain to the source of the NMOS transistor 44.

As, of the n switch circuits 411 to 41n, the number of switch circuits in the ON state increases, a current Isum which flows from the common power supply 42 to the current inflow sides of the switch circuits 411 to 41n becomes large. Hence, the current value of the current Isum becomes large as the number of units with errors increases in the units obtained by dividing the data.

In a reference constant current path 46, "0" or "1" is set at gate terminals B0 and B1 of MOS transistors in accordance with the allowable value. The allowable value can be set from outside and stored.

The differential current between the current Isum and a current Iref from a power supply 48 to the reference constant current path can be detected at an output node 47a of an inverter 47.

When the current Isum is larger than the current Iref, the inspection section 39 provides determination data indicating that the write is invalid to the input/output control section 27.

According to this embodiment, when the number of units with errors exceeds the allowable value, "invalid" can be detected, and the same effect as in the third embodiment can be obtained.

In this embodiment, data to be written can be divided into, e.g., 1-bit units, 1-byte units, or 2-byte units.

In the above embodiments, the layout of the constituent elements may be changed as long as they can implement the same operation as described above. The constituent elements may freely be combined or freely be divided. Several constituent elements may be omitted. The constituent elements may freely be combined over the several embodiments. That is, the above embodiments are not limited to the above-described arrangements, and various changes and modifications of the constituent elements can be made within the spirit and scope of the present invention.

What is claimed is:

1. A memory device comprising:
  a data storage section;
  a comparison section which compares in write processing, for data being target of the write processing, a state before the data is stored in the data storage section with a state of the data which is stored in the data storage section and read out from the data storage section, and compares in erase processing, for a data block being target of erase processing of the data storage section, an actual state of the data block after the erase processing is executed with a theoretical data state after the erase processing is executed;
  a section which obtains a first number of errors which is the number of bits which do not coincide or the number of error byte units in which incoincidence occurs for the write processing, and obtains a second number of errors which is the number of bits which do not coincide or the number of error byte units in which incoincidence occurs for the erase processing on the basis of a comparison result from the comparison section; and
  a section which returns the first number of errors to a host device for the write processing, and returns the second number of errors to the host device for the erase processing.

2. A device according to claim 1, wherein the first and second numbers of errors are the number of 1-byte units in which incoincidence occurs.

3. A device according to claim 1, wherein the first and second numbers of errors are the number of 2-byte units in which incoincidence occurs.

4. A device according to claim 1, further comprising a section which stores a first allowable value representing a first allowable range of the first number of errors for the write processing and a second allowable value representing a second allowable range of the second number of errors for the erase processing, and
  a section which validates the write processing for the data storage section when the number of errors falls within the first allowable range and invalidates the write processing for the data storage section when the first number of errors falls outside the first allowable range, and validates the erase processing for the data storage section when the second number of errors falls within the second allowable range and invalidates the erase processing for the data storage section when the second number of errors falls outside the second allowable range.

5. A device according to claim 4, wherein the first allowable value is set on the basis of an error-correctable number.

6. A device according to claim 1, wherein the data storage section is a NAND memory.

7. A memory device comprising:
  a data storage section;
  a section which stores a signal representing whether a write processing for the data storage section is normal for each of units which are obtained by dividing data being target of the write processing by a predetermined data length for the write processing, and whether erase processing for the data storage section is normal for each of units which are obtained by dividing a data block being target of the erase processing by the predetermined data length for the erase processing;
  a section which stores a first allowable value representing a first allowable range of a first number of abnormal signals representing that the write processing for the data storage section is abnormal, and stores a second allowable value representing a second allowable range of a second number of abnormal signals representing that the erase processing for the data storage section is abnormal;
  a section which returns the first number of abnormal signals to a host device for the write processing, and returns the second number of abnormal signals to the host device for the erase processing; and
  a section which invalidates the write processing when the first number of abnormal signals of the signals falls outside the first allowable range for the write processing, and invalidates the erase processing when the second number of abnormal signals of the signals falls outside the second allowable range for the erase processing,
  wherein the first and second allowable values are set from outside, and
  the predetermined data length is a bit or byte unit.

8. A device according to claim 7, wherein the allowable value is set on the basis of an error-correctable number.

9. A device according to claim 7, wherein the data storage section is a NAND memory.

10. A memory card comprising:
  an non-volatile semiconductor memory; and
  a controller which executes write processing for the non-volatile semiconductor memory,
  wherein the non-volatile semiconductor memory comprising:
  a data storage section;

a comparison section which compares in write processing, for data being target of the write processing, a state before the data is stored in the data storage section with a state of the data which is stored in the data storage section and read out from the data storage section, and compares in erase processing, for a data block being target of erase processing of the data storage section, an actual state of the data block after the erase processing is executed with a theoretical data state after the erase processing is executed;

a section which obtains a first number of errors which is the number of bits which do not coincide or the number of error byte units in which incoincidence occurs for the write processing, and obtains a second number of errors which is the number of bits which do not coincide or the number of error byte units in which incoincidence occurs for the erase processing on the basis of a comparison result from the comparison section; and a section which returns the first number of errors to a host device for the write processing, and returns the second number of errors to the host device for the erase processing.

* * * * *